(12) United States Patent
Jensen

(10) Patent No.: US 7,324,789 B2
(45) Date of Patent: Jan. 29, 2008

(54) PLL FREQUENCY SYNTHESIZER ARCHITECTURE FOR LOW PHASE NOISE AND REFERENCE SPURS

(75) Inventor: Henrik T. Jensen, Long Beach, CA (US)

(73) Assignee: Broadcom Corporation, Irvine, CA (US)

( * ) Notice: Subject to any disclaimer, the term of this patent is extended or adjusted under 35 U.S.C. 154(b) by 423 days.

(21) Appl. No.: 11/039,116

(22) Filed: Jan. 20, 2005

(65) Prior Publication Data

US 2006/0160492 A1  Jul. 20, 2006

(51) Int. Cl.
*H04B 1/40* (2006.01)

(52) U.S. Cl. .......................... 455/76; 455/118; 455/84; 455/87; 455/86

(58) Field of Classification Search .................. 455/76, 455/118, 84, 165.1, 161.1, 151.3, 127.4, 180.3, 455/213, 526, 87, 139, 86
See application file for complete search history.

(56) References Cited

U.S. PATENT DOCUMENTS 4,114,110 A * 9/1978 Nossen ........................... 331/2
5,028,887 A * 7/1991 Gilmore ....................... 331/18
5,152,005 A * 9/1992 Bickley ......................... 455/76
5,757,239 A * 5/1998 Gilmore ....................... 331/18
5,999,581 A * 12/1999 Bellaouar et al. ........... 375/377
6,154,640 A * 11/2000 Itoh et al. ...................... 455/76
6,400,930 B1 * 6/2002 Barak ............................ 455/76
6,965,753 B1 * 11/2005 Miller et al. ................ 455/12.1
7,113,751 B2 * 9/2006 Barak ............................ 455/76
7,171,182 B2 * 1/2007 Filipovic .................... 455/258
2003/0008626 A1 * 1/2003 Miyano et al. ............. 455/114
2005/0068430 A1 * 3/2005 Yano et al. .................. 348/241
2006/0141963 A1 * 6/2006 Maxim et al. ............ 455/192.1
2006/0258311 A1 * 11/2006 Pestryakov et al. ...... 455/165.1

* cited by examiner

*Primary Examiner*—Lana Le
*Assistant Examiner*—Amar Daglawi
(74) *Attorney, Agent, or Firm*—Garlick Harrison & Markison; Holly L. Rudnick

(57) ABSTRACT

A frequency synthesizer for use in a transceiver generates a relatively high reference frequency with fine frequency resolution and low in-band phase noise by using a digital processor to generate a digital reference signal at a finely-tuned reference frequency. A Digital-to-Analog Converter (DAC) converts the digital reference signal to an analog reference signal, and a low pass filter filters the analog reference signal to produce a filtered analog reference signal. The frequency synthesizer further includes a phase locked loop for up-converting the filtered analog reference signal from an IF signal to an RF signal.

16 Claims, 10 Drawing Sheets

PLL FREQUENCY SYNTHESIZER ARCHITECTURE FOR LOW PHASE NOISE AND REFERENCE SPURS

BACKGROUND

1. Technical Field

The present invention relates to wireless communications and, more particularly, wideband wireless communication systems.

2. Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards, including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, etc., communicates directly or indirectly with other wireless communication devices. For direct communications (also known as point-to-point communications), the participating wireless communication devices tune their receivers and transmitters to the same channel or channels (e.g., one of a plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via a public switch telephone network (PSTN), via the Internet, and/or via some other wide area network.

Each wireless communication device includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier stage. The data modulation stage converts raw data into baseband signals in accordance with the particular wireless communication standard. The one or more intermediate frequency stages mix the baseband signals with one or more local oscillations to produce RF signals. The power amplifier stage amplifies the RF signals prior to transmission via an antenna.

As is also known, the receiver is coupled to the antenna and includes a low noise amplifier, one or more intermediate frequency stages, a filtering stage, and a data recovery stage. The low noise amplifier receives an inbound RF signal via the antenna and amplifies it. The one or more intermediate frequency stages mix the amplified RF signal with one or more local oscillations to convert the amplified RF signal into a baseband signal or an intermediate frequency (IF) signal. As used herein, the term "low IF" refers to both baseband and intermediate frequency signals. A filtering stage filters the low IF signals to attenuate unwanted out of band signals to produce a filtered signal. The data recovery stage demodulates the filtered signal to recover the raw data in accordance with the particular wireless communication standard.

The demand for high performance local oscillator generators (LO-GENs) for use in RF transceivers is growing with the increasing performance and integration requirements of wireless communications systems, such as WiFi systems and cellular telephony. The oscillators used in RF transceivers are usually embedded in a frequency synthesizer environment, so as to achieve a precise definition of the output frequency.

Synthesizer design remains a challenging aspect of RF system design, because of the stringent requirements typically imposed on frequency synthesizers. For example, RF transceiver LO-GENs are typically required to be defined with an output frequency accuracy on the order of a few parts per million (PPM). Furthermore, in most cases, the output frequency must also be capable of being varied in small precise steps, such as a few hundred kilo-hertz (kHz), corresponding to the RF channel spacing.

In addition to accuracy and channel spacing, several other aspects of LO-GENs influence the performance of a transceiver, such as phase noise, reference spurs and lock time. The phase noise of the LO-GEN impacts both the receive and transmit paths. For the receive path, if the phase noise mixes with nearby interferers that are then converted onto the desired channel, the signal-to-noise ratio of the received signal can be adversely affected. In addition, reference spurs may cause the receiver to down-convert undesired interferers, and may cause the transmitter to violate spectral mask requirements specified by the communications standard. Furthermore, the lock time required in typical RF systems varies from a few milliseconds (ms.) to a few tens of microseconds (us.). As used herein, the term "lock time" refers to an indication of how fast a new frequency is established when the RF transceiver commands a change in the channel.

Two types of frequency synthesizers based upon phase locked loops have gained wide spread use in wireless systems: the fractional-N and the integer-N frequency synthesizers. Fractional-N frequency synthesis is a popular indirect frequency synthesis method for high performance applications, such as cellular telephony, due to the ability of fractional-N synthesizers to synthesize frequencies over wide bandwidths with narrow channel spacing. For example, in GSM cellular telephony, one pair of RF bands, i.e., transmit (TX) and receive (RX) bands, consists of the frequencies 880.2 MHz -914.8 MHz and 925.3 Mhz-959.9 MHz, respectively. Within each of these bands, the GSM channel spacing is 200 kHz. The fractional-N frequency synthesizer is capable of achieving a very fine output frequency resolution to accommodate such narrow channel spacing.

A fractional-N PLL frequency synthesizer typically includes a precise crystal oscillator (X-TAL) providing a reference frequency, a phase and frequency detector (PFD), a charge pump (CP), a lowpass loop filter (LPF), a voltage controlled oscillator (VCO), and several divider blocks in the feedback path that each divide the incoming signal by some integer of either fixed or on-the-fly programmable value. Typically, the fixed dividers are in the front-end of the divider chain, while the programmable divider (referred to herein as the "multi-modulus divider") is the last divider stage before the feedback signal is inputted to the PFD feedback terminal to achieve fine (e.g., fractional) frequency tuning of the output signal.

However, fractional-N frequency synthesizers suffer from a critical drawback, namely the generation of in-band spurs due to non-linear behavior of the PFD and charge pump. Ideally, the charge transferred into the loop filter is proportional to the phase difference between reference and feedback signals. In practice, however, the characteristics of the PFD/CP combination does not provide a completely linear transfer curve. When the frequency synthesizer is operating in lock, the phase difference assumes different values due to the changing divide ratio in the feedback path. Thus, the changing divide ratio triggers non-linearities of the PFD/CP, and creates a noise floor that increases the in-band phase noise of the frequency synthesizer. Such increase of phase noise may be prohibitively large for systems with stringent phase noise requirements.

A frequency synthesizer approach that can be designed to satisfy very stringent phase noise requirements is the integer-N frequency synthesizer. The integer-N frequency synthesizer includes the same components as the fractional-N synthesizer with the difference being that the multi-modulus divider does not change dynamically during operation of the synthesizer in a particular RF channel. In other words, the divide ratio of the feedback path remains constant for operation in-between channel steps. The fact that the divide ratio is kept constant causes the PFD/CP combination to operate highly linearly since the phase excursions of the feedback signal are very limited.

However, the integer-N architecture requires that the reference frequency be equal to the desired channel spacing due to the fact that the resolution of the feedback divider is one. Thus, for a channel spacing of 200 kHz, the PLL reference signal must be 200 kHz. Such low reference signal gives rise to considerable "reference spurs" (i.e., periodic modulations of the VCO generating tones around the RF carrier).

For example, when the loop is completely in lock, ideally, no pulses are generated by the CP. In practice, due to finite reset delay of the PFD and due to current source mismatches of the CP, such ideal equilibrium is not achieved. Rather, the VCO control voltage experiences a finite transient at each phase comparison instant around an equilibrium point. Thus, the VCO output, i.e., the RF carrier, contains sidebands corresponding to such "feed-through" of the reference frequency. The problem of reference spurs is a difficult one, especially if the reference spurs fall in-band. Designing the PLL with a narrow signal filter may provide some attenuation of such reference spurs, but in many systems it is difficult or impossible to attenuate such spurs enough while at the same time employing a signal filter bandwidth large enough to ensure fast synthesizer settling (lock time).

Thus, fractional-N and integer-N frequency synthesizers each have advantages and drawbacks. For fractional-N synthesizers, the advantages are fine frequency resolution, while employing a relatively high reference frequency. This allows for a strong attenuation of the reference spurs through the PLL signal filter while still maintaining wide enough bandwidth for fast synthesizer settling (lock time). The drawback of the fractional-N synthesizer is an elevated in-band phase noise level due to the triggering of PFD/CP non-linearities. For integer-N synthesizers, the advantage is generally very low in-band phase noise. The drawback is a high reference spur level, which can only be reduced by narrowing the PLL signal filter. Such narrowness results in slow synthesizer settling (lock time).

Therefore, a need exists for a frequency synthesizer design for use in transceivers that combines the advantages of the fractional-N and integer-N approaches, but without the mentioned drawbacks.

SUMMARY OF THE INVENTION

A frequency synthesizer for use in a transceiver is provided that is capable of generating a relatively high reference frequency with fine frequency resolution and low in-band phase noise. The frequency synthesizer includes a digital processor for generating a digital reference signal at a finely-tuned reference frequency. A Digital-to-Analog Converter (DAC) converts the digital reference signal to an analog reference signal, and a low pass filter filters the analog reference signal to produce a filtered analog reference signal. The frequency synthesizer further includes a phase locked loop for up-converting the filtered analog reference signal from an IF signal to an RF signal.

More specifically, in one embodiment, the digital processor is programmed with a fine-tune frequency value to control the deviation of the digital reference signal from a fixed frequency value to fine-tune the reference frequency. In addition, the phase locked loop is an integer-N phase locked loop.

In further embodiments, the digital processor also includes a phase accumulator for generating a phase signal corresponding to the fine-tune frequency value, and a modulator for modulating the phase signal to produce a complex digital signal. At least one digital low pass filter within the digital processor filters the complex digital signal to produce a filtered complex digital signal, including an in-phase signal and a quadrature-phase signal.

In still a further embodiment, the digital processor further includes a direct digital frequency synthesizer for generating a cosine digital function and a sine digital function, a first digital multiplier for multiplying the in-phase signal with the cosine digital function to produce a first digital signal, a second digital multiplier for multiplying the quadrature-phase signal with the sine digital function to produce a second digital signal, and a subtraction node for subtracting the first digital signal from the second digital signal to produce the digital reference signal.

Other aspects of the present invention will become apparent with further reference to the drawings and specification, which follow.

BRIEF DESCRIPTION OF THE DRAWINGS

A better understanding of the present invention can be obtained when the following detailed description of the preferred embodiment is considered with the following drawings, in which.

DETAILED DESCRIPTION OF THE DRAWINGS

Figure 1:
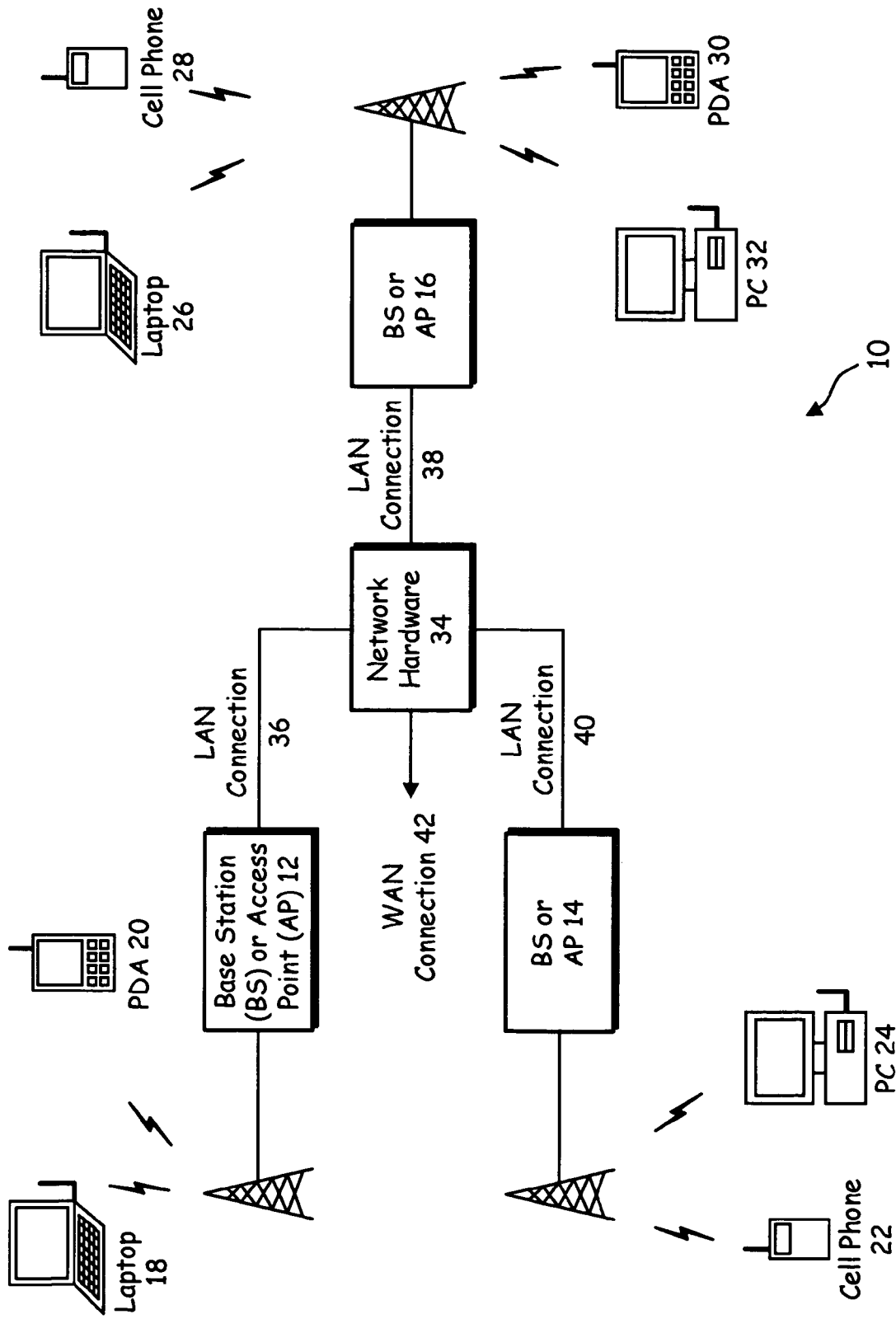
FIG. 1 is a functional block diagram illustrating a communication system that includes a plurality of base stations or access points (APs), a plurality of wireless communication devices and a network hardware component.

FIG. 1 is a functional block diagram illustrating a communication system 10 that includes a plurality of base stations or access points (APs) 12-16, a plurality of wireless communication devices 18-32 and a network hardware component 34. The wireless communication devices 18-32 may be laptop computers 18 and 26, personal digital assistants 20 and 30, personal computers 24 and 32 and/or cellular telephones 22 and 28. The details of the wireless communication devices will be described in greater detail with reference to FIGS. 2-9.

The base stations or APs 12-16 are operably coupled to the network hardware component 34 via local area network (LAN) connections 36, 38 and 40. The network hardware component 34, which may be a router, switch, bridge, modem, system controller, etc., provides a wide area network connection 42 for the communication system 10. Each of the base stations or access points 12-16 has an associated antenna or antenna array to communicate with the wireless communication devices in its area. Typically, the wireless communication devices 18-32 register with the particular base station or access points 12-16 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. For example, access points are typically used in Bluetooth systems. Regardless of the particular type of communication system, each wireless communication device and each of the base stations or access points includes a built-in radio and/or is coupled to a radio. The radio includes a transceiver (transmitter and receiver) for modulating/demodulating information (data or speech) bits into a format that comports with the type of communication system.

Figure 2:
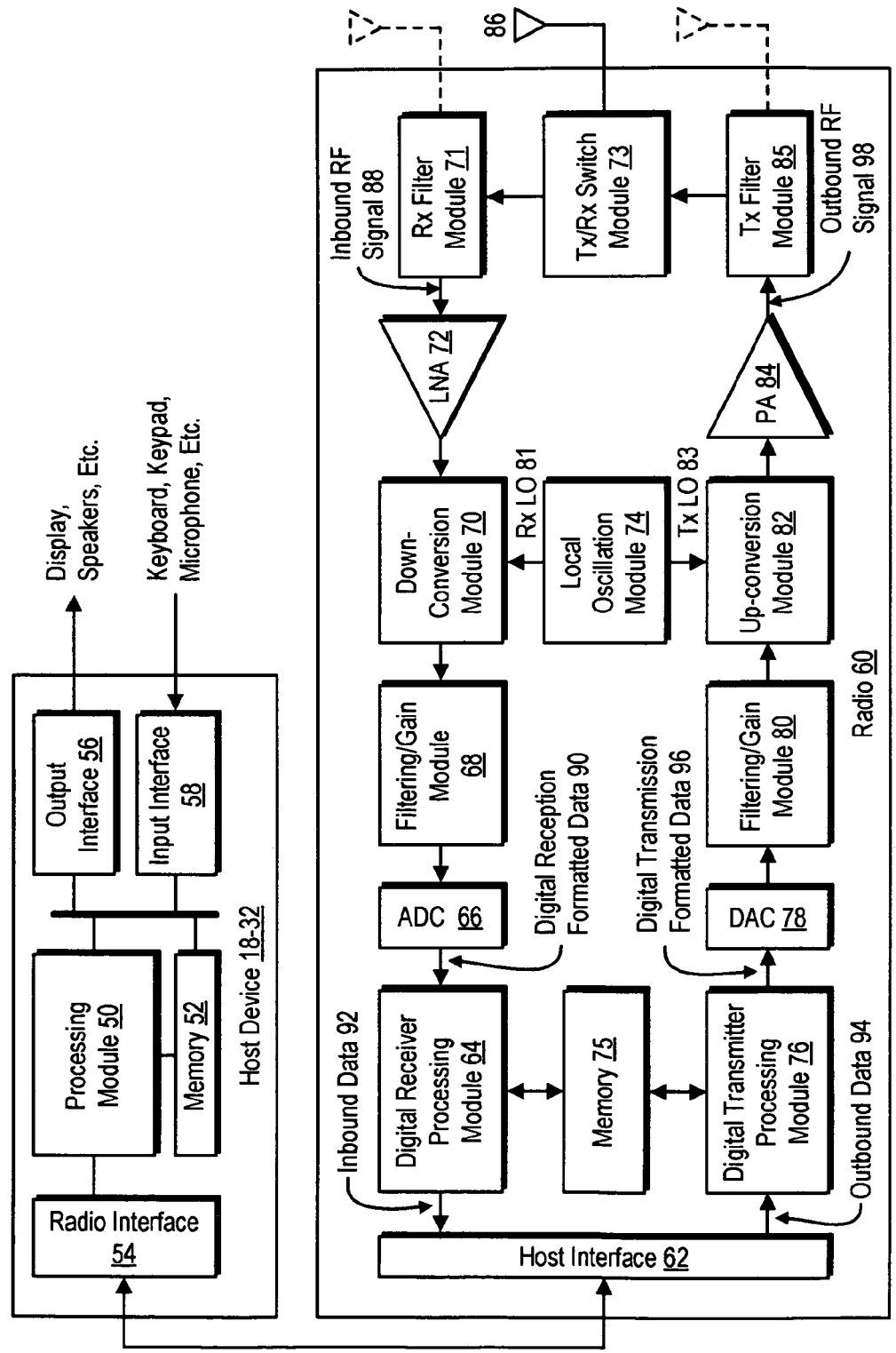
FIG. 2 is a schematic block diagram illustrating a wireless communication device as a host device and an associated radio.

FIG. 2 is a schematic block diagram illustrating a wireless communication device 18-32 as a host device and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host wireless communication device 18-32 includes a processing module 50, a memory 52, a radio interface 54, an input interface 58 and an output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output device such as a display, monitor, speakers, etc., such that the received data may be displayed. The radio interface 54 also provides data from the processing module 50 to the radio 60. The processing module 50 may receive the outbound data from an input device such as a keyboard, keypad, microphone, etc., via the input interface 58 or generate the data itself. For data received via the input interface 58, the processing module 50 may perform a corresponding host function on the data and/or route it to the radio 60 via the radio interface 54.

Radio 60 includes a host interface 62, a digital receiver processing module 64, an analog-to-digital converter 66, a filtering/gain module 68, a down-conversion module 70, a a low noise amplifier 72, receiver filter module 71, a transmitter/receiver (Tx/RX) switch module 73, a local oscillation module 74, a memory 75, a digital transmitter processing module 76, a digital-to-analog converter 78, a filtering/gain module 80, an IF mixing up-conversion module 82, a power amplifier 84, a transmitter filter module 85, and an antenna 86. The antenna 86 is shared by the transmit and receive paths as regulated by the Tx/Rx switch module 73. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, demodulation, constellation demapping, decoding, and/or descrambling. The digital transmitter functions include, but are not limited to, scrambling, encoding, constellation mapping, modulation. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the digital receiver processing module 64 and/or the digital transmitter processing module 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. The memory 75 stores, and the digital receiver processing module 64 and/or the digital transmitter processing module 76 executes, operational instructions corresponding to at least some of the functions illustrated herein.

In operation, the radio 60 receives outbound data 94 from the host wireless communication device 18-32 via the host interface 62. The host interface 62 routes the outbound data 94 to the digital transmitter processing module 76, which processes the outbound data 94 in accordance with a particular wireless communication standard (e.g., IEEE 802.11a, IEEE 802.11b, Bluetooth, etc.) to produce digital transmission formatted data 96. The digital transmission formatted data 96 will be a digital baseband signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain module 80 filters and/or adjusts the gain of the analog baseband signal prior to providing it to the up-conversion module 82. The up-conversion module 82 directly converts the analog baseband signal, or low IF signal, into an RF signal based on a transmitter local oscillation 83 provided by local oscillation module 74. The power amplifier 84 amplifies the RF signal to produce an outbound RF signal 98, which is filtered by the transmitter filter module 85. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch module 73, where the Rx filter module 71 bandpass filters the inbound RF signal 88. The Rx filter module 71 provides the filtered RF signal to low noise amplifier 72, which amplifies the inbound RF signal 88 to produce an amplified inbound RF signal. The low noise amplifier 72 provides the amplified inbound RF signal to the down-conversion module 70, which directly converts the amplified inbound RF signal into an inbound low IF signal or baseband signal based on a receiver local oscillation signal 81 provided by local oscillation module 74. The down-conversion module 70 provides the inbound low IF signal or baseband signal to the filtering/gain module 68. The filtering/gain module 68 may be implemented in accordance with the teachings of the present invention to filter and/or attenuate the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host wireless communication device 18-32 via the radio interface 54.

As one of average skill in the art will appreciate, the wireless communication device of FIG. 2 may be implemented using one or more integrated circuits. For example, the host device may be implemented on a first integrated circuit, while the digital receiver processing module 64, the digital transmitter processing module 76 and memory 75 are implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver processing module 64 and the digital transmitter processing module 76 may be a common processing device implemented on a single integrated circuit. Further, memory 52 and memory 75 may be implemented on a single integrated circuit and/or on the same integrated circuit as the common processing modules of processing module 50, the digital receiver processing module 64, and the digital transmitter processing module 76.

The wireless communication device of FIG. 2 is one that may be implemented to include either a direct conversion from RF to baseband and baseband to RF or for a conversion by way of a low intermediate frequency. In either implementation, however, for an up-conversion module 82 and a down-conversion module 70, it is required to provide accurate frequency conversion. For the down-conversion module 70 and up-conversion module 82 to accurately mix a signal, however, it is important that the local oscillation module 74 provide an accurate local oscillation signal for mixing with the baseband/IF or RF by the up-conversion module 82 and down-conversion module 70, respectively. Accordingly, the local oscillation module 74 includes circuitry for adjusting an output frequency of a local oscillation signal provided therefrom. As will be explained in greater detail, below, the local oscillation module 74 uses a frequency synthesizer to generate a relatively high reference frequency with fine frequency resolution and low in-band phase noise. While one embodiment of the present invention includes local oscillation module 74, up-conversion module 82 and down-conversion module 70 that are implemented to perform conversion between a low intermediate frequency (IF) and RF, it is understood that the principles herein may also be applied readily to systems that implement a direct conversion between baseband and RF.

Figure 3:
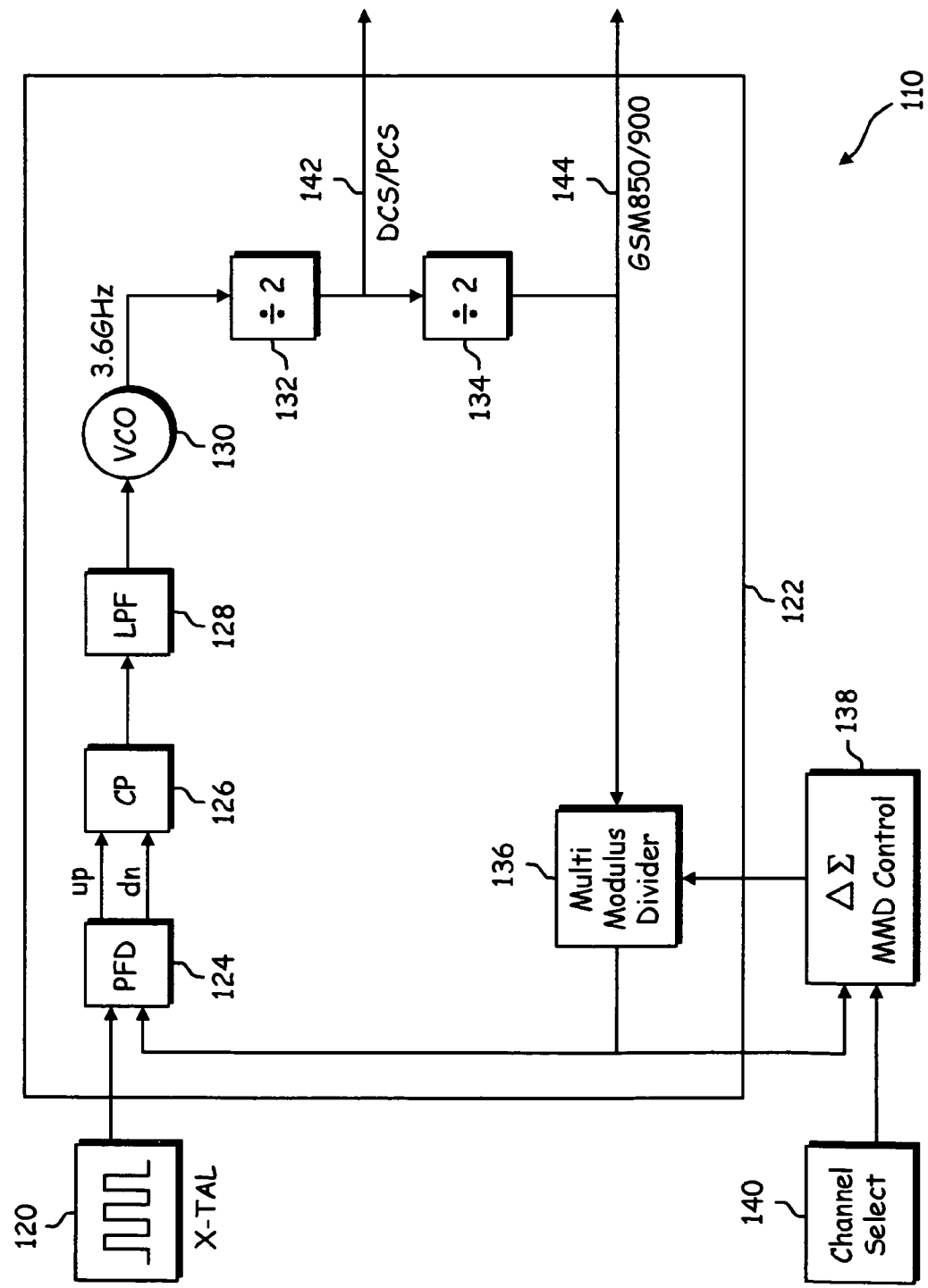
FIG. 3 is a schematic block diagram illustrating an exemplary fractional-N frequency synthesizer.

FIG. 3 is a schematic block diagram of an exemplary fractional-N frequency synthesizer 110 that can be implemented within the local oscillation module 74 of FIG. 2. One typical application of the fractional-N frequency synthesizer 110 of FIG. 3 is GSM cellular telephony, though the concepts may readily be applied to other types of communication networks. The fractional-N frequency synthesizer 110 includes a precise crystal oscillator (X-TAL) 120 providing a reference frequency and a phase locked loop (PLL) 122 that includes a phase and frequency detector (PFD) 124, a charge pump (CP) 126, a lowpass loop filter (LPF) 128, a voltage controlled oscillator (VCO) 130, and several divider blocks 132, 134 and 126 in the feedback path that each divide the incoming signal by some integer of either fixed or on-the-fly programmable value.

Typically, fixed dividers 132 and 134 are located in the front-end of the divider chain, while the programmable divider, referred to herein as the multi-modulus divider (MMD) 136, is the last divider stage before the feedback signal is input to the PFD feedback terminal. Typically, the MMD 136 is only capable of dividing by a small number of different integer divide values. The two fixed divide-by-2 blocks 132 and 134 of the PLL 122 allows the synthesizer to easily generate in-phase (I) and quadrature (Q) carrier signals in four different GSM bands, namely the bands around 850 MHz, 900 Mhz, 1800 Mhz, and 1900 MHz, by tuning the VCO 130 appropriately around 3.6 GHz. RF output signals 142 in the DCS/PCS bands are produced using the first divide-by-2 block 132, while RF output signals 144 in the GSM850/900 band are produced using both divide-by-2 blocks 132 and 133. It should be noted that without the two fixed divide-by-2 blocks 132 and 134, two separate VCOs 130 would have to be employed to support the wide range of frequency tuning.

A qualitative description of the operation of the fractional-N frequency synthesizer 110 is as follows. X-TAL 120 generates a 26 MHz sinusoid reference signal, which is extracted by the PFD 124 whose output is an error signal (in phase and/or frequency). In a properly designed PLL 122, the feedback loop properties of the fractional-N PLL 122 results in the VCO 130 output "locking" to a frequency equal to the product of crystal oscillator 120 reference frequency and the "average" divide ratio of the divider chain 132, 134 and 136. One method of generating an "average" divide ratio by selecting from a few integer divide values is to employ an over-sampling $\Delta\Sigma$ modulator 138 to control the selection of divide ratios of the MMD 136. Depending upon the integer output of the $\Delta\Sigma$ modulator 138, a certain integer divide ratio is selected for the next cycle by a channel select controller 140. The selection of a new divide ratio is triggered by a rising edge of the MMD 136 output, and hence occurs with a rate approximately equal to the reference frequency.

For example, an all-digital $\Delta\Sigma$ modulator 138 is capable of reproducing a high resolution constant input value, for example a 20-bit value, as the time average of a long sequence of coarse integer valued outputs, for example binary outputs. Specifically, on a sample-by-sample basis, the coarse $\Delta\Sigma$ modulator 138 output selects the divide ratio for the next cycle. By alternating pseudo randomly between integer divide values, the $\Delta\Sigma$ modulator 138 can effectively interpolate a fractional division ratio with fine resolution such that the frequency resolution requirements of high performance applications, such as cellular telephony, can be accommodated for. For example, in order for the GSM output of the fractional-N PLL frequency synthesizer 110 to lock to a frequency of 890.0 MHz, using a 26 MHz crystal reference oscillator 120, the average divide ratio of the MMD 136 must be equal to 890/26=34.2308.

Thus, the channel select 140 input to the $\Delta\Sigma$ modulator 138 is the number 890/26 represented with high accuracy, for example 20 bits. It is the task of the $\Delta\Sigma$ modulator 138 to output only integer valued samples, corresponding to the available divide values of the MMD 136, in such a fashion that the average value of the outputs equals 890/26. This average divide ratio can be achieved in various ways. For example, if a $\Delta\Sigma$ modulator 138 with binary output is employed, the MMD 136 divides by 33 whenever the $\Delta\Sigma$ modulator 138 output equals $-1$, and the MMD 136 divides by 35 whenever the $\Delta\Sigma$ modulator 138 output equals 1. The $\Delta\Sigma$ modulator 138 chooses between the divide ratios 33 and 35 in such a pattern that the average ratio is 890/26, and such that the sample-by-sample error, which is equal to the difference between the chosen integer divide value and the ratio 890/26, is modulated to predominantly occupy high frequencies.

By providing this spectral shaping of the divide error, most of the error can be removed by the lowpass loop filter (LPF) 128, resulting in a high quality output oscillation, or, equivalently, an output oscillation with very little phase noise, approximately as if the feedback path implemented a true fractional divider. For fractional-N PLL frequency synthesis, two types of $\Delta\Sigma$ modulators 138 have been used. One is the so-called "single-quantizer" $\Delta\Sigma$ modulator and the other is the so-called "MASH" $\Delta\Sigma$ modulator.

It follows from the above discussion of the PFD 124 and the CP 126 that under nominal conditions, current pulses proportional to either a phase or a frequency difference between the reference and the feedback signals are generated by the PFD/CP combination. The action of the closed feedback loop is to cause the feedback signal to eventually settle such that both signals are "locked" in both phase and frequency. The degree to which deviations away from the locked state are allowed depends upon the sharpness of the loop filter 128 and ultimately determines the amount of "phase noise" in the output. A sharper loop filter 128 results in less phase noise at the expense of an increased loop settling time. Essentially, the loop settling time is the amount of time it takes for the loop to settle accurately when changing from channel to channel.

Figure 4:
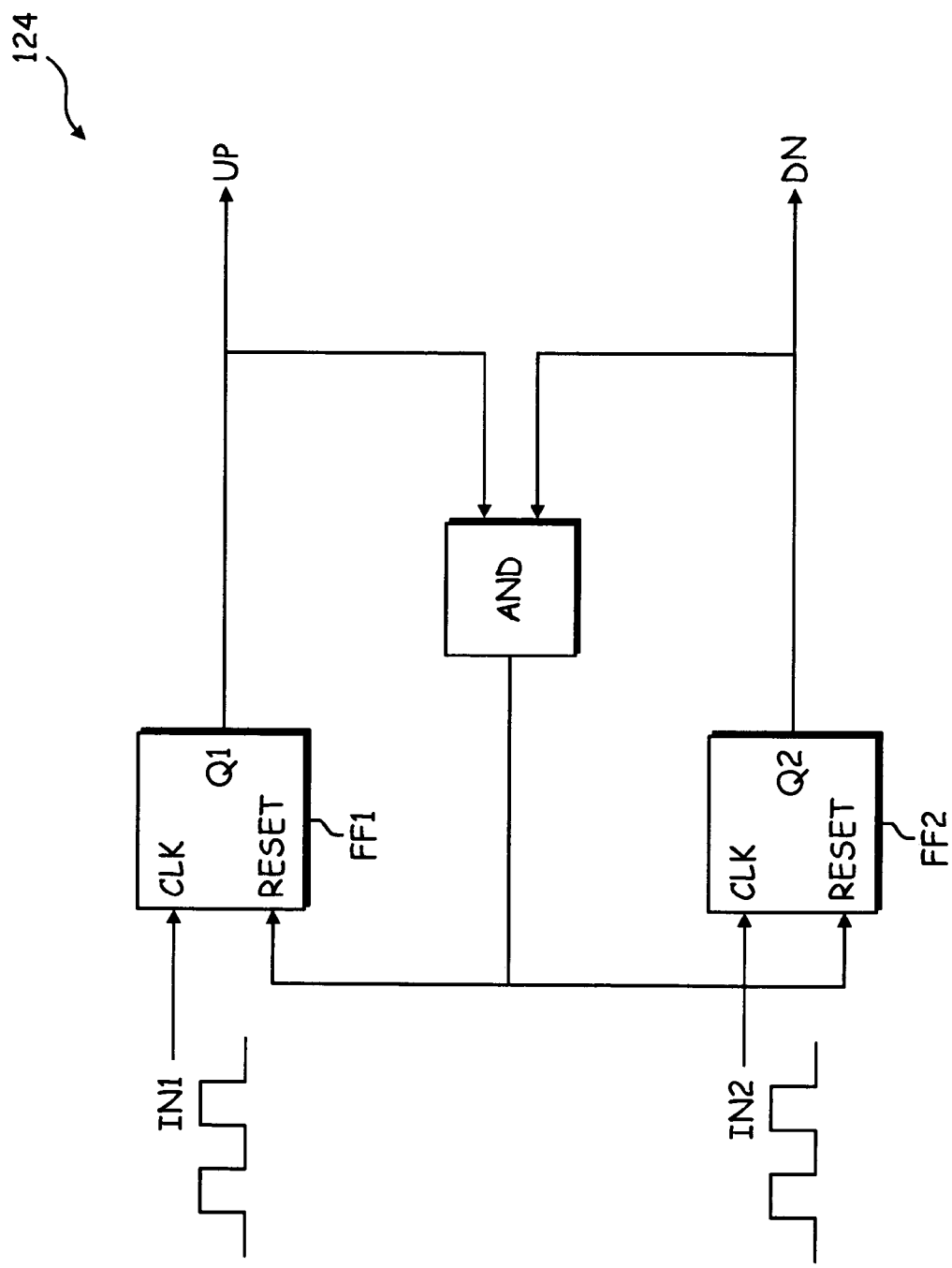
FIG. 4 is schematic block diagram illustrating an exemplary phase and frequency detector (PFD) for use in embodiments of the present invention.

FIG. 4 shows details of a typical implementation of the PFD 124. Two reset-able flip-flops FF1 and FF2 are coupled with an AND gate in a feedback loop. Assuming that the signals IN1 and IN2 are appropriate for driving digital circuitry, the operation of the PFD 124 is as follows. After reset, the outputs UP and DN are LOW, or 0. If IN1 goes HIGH, or 1, then UP goes HIGH. When IN2 goes HIGH, DN goes HIGH momentarily, resulting in a positive edge at the AND gate output. This edge resets the two flip-flops FF1 and FF2 to the initial state (UP,DN)=(0,0). Thus, any phase difference between the two signals IN1 and IN2 results in the PFD 124 residing in the state (UP,DN)=(1,0) for a duration of time proportional to the phase difference between IN1 and IN2. Similarly, any difference in frequency between IN1 and IN2 results in the PFD 124 residing in either the state (UP,DN)=(1,0) or the state (UP,DN)=(0,1), depending upon the sign of the frequency difference.

Figure 5:
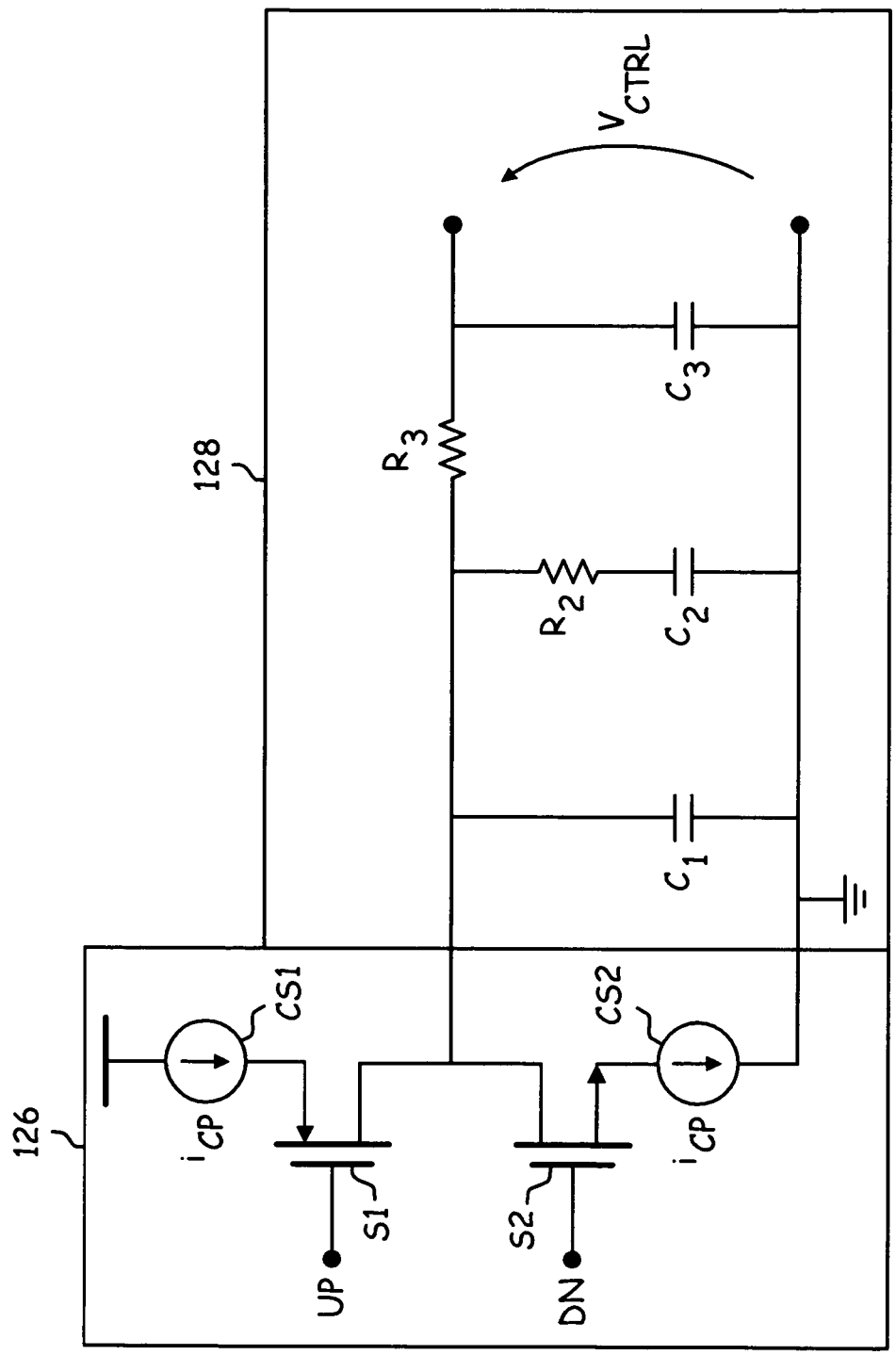
FIG. 5 is a circuit schematic illustrating an exemplary charge pump and loop filter combination for use in embodiments of the present invention.

FIG. 5 shows details of a typical implementation of the charge pump 126 and loop filter 128 combination. The charge pump 126 responds to the (UP,DN) control signals of the PFD by either "pumping" current into the loop filter 128 or moving current out of the loop filter 128 and "pumping" it into ground. The charge pump 126 includes two equally weighted current sources CS1 and CS2, each with a nominal output current $I_{CP}$, in an arrangement with two switches S1 and S2 controlled by UP and DN. Thus, it follows that the CP 126 essentially functions as an asynchronously clocked digital-to-analog converter (DAC) whose nominal output $y_{CP}(t)$ depends upon the digital inputs UP and DN such that $$y_{CP}(t) = \begin{cases} I_{CP}, & \text{if } \{UP, DN\} = \{1, 0\} \\ 0, & \text{if } \{UP, DN\} = \{1, 1\} \\ 0, & \text{if } \{UP, DN\} = \{0, 0\} \\ -I_{CP}, & \text{if } \{UP, DN\} = \{0, 1\} \end{cases}$$

The current pulses of the CP 126 are filtered by the loop filter 128 thereby generating a smooth output voltage referred to as the "control voltage", $v_{ctrl}$. The loop filter 128 typically consists of passive components, e.g., resistors R2 and R3 and capacitors C1, C2 and C3. The loop filter 128 shown in FIG. 5 is a third-order loop filter because it contains three poles.

Referring again to FIG. 3, the oscillation frequency of the VCO 130 of the PLL 122 is determined by the control voltage, $V_{CTRL}$, shown in FIG. 5. The sensitivity of the VCO 130 to changes in the control voltage is referred to as the VCO gain, denoted herein as $K_{VCO}$. This sensitivity is typically specified in MHz per Volt. For example, typical numbers for VCO gain are in the range 20 MHz/V to 50 MHz/V. In a practical setting, the VCO 130 typically undergoes "calibration" as part of the operating the PLL 122. This calibration determines the operating point of the VCO 130 and allows the VCO 130 to function over a wide range of frequencies.

If $\Theta_{IN}$ denotes the input phase, i.e., the crystal reference, $\Theta_{DCS/PCS}$ and $\Theta_{GSM850/900}$ denote the outputs in the four bands, the PFD/charge pump configuration is represented as a gain, $i_{CP}$, the VCO is represented as a gain, $K_{VCO}$, and the multi-modulus divider is represented as a fixed divide-by-N with and additive noise source, $\Theta_{\Delta\Sigma}$, representing the divide error, applying standard linear system analysis, the transfer functions, denoted $H_{DCS/PCS}(s)$ and $H_{GSM850/900}(s)$, between the RF outputs in the DCS/PCS and GSM850/900 bands, respectively, and input can be expressed in terms of charge pump current, $i_{CP}$, loop components, VCO sensitivity, $k_{VCO}$, and divide ratios. Specifically, defining:

$$P(s) = \frac{C_2 R_2 s + 1}{C_1 C_2 C_3 R_2 R_3 s^2 + (C_1 C_3 R_3 + C_1 C_2 R_2 + C_2 C_3 R_2 + C_2 C_3 R_3)} =$$
$$s + (C_1 + C_2 + C_3)$$

$$\frac{n_1 s + 1}{d_2 s^2 + d_1 s + d_0}$$

and $$K_{CV} = i_{CP} \times K_{VCO}, \quad M = 4 \times N,$$

it can be shown that $$H_{DCS/PCS}(s) = \frac{\frac{M}{2} K_{CV}(n_1 s + 1)}{M d_2 s^4 + M d_1 s^3 + M d_0 s^2 + K_{CV}(n_1 s + 1)},$$

and thus $$H_{GSM850/900}(s) = \frac{1}{2} H_{DCS/PCS}(s).$$

The transfer functions $H_{DCS/PCS}(s)$ and $H_{GSM850/900}(s)$ will be referred to herein as the PLL signal filter, independent of which RF band is being considered.

As an example, for operation in the GSM band at a frequency offset of 400 kHz, the required phase noise level is −130dBc/Hz. In addition to such strict phase noise requirements, the GSM standard requires RF carrier frequency settling to an absolute accuracy of 90 Hz within 280 us. The term "settling" here describes the excursion of the RF carrier vs. time as the synthesizer changes RF channel. As mentioned above, the VCO 130 is typically calibrated for every channel hop. This calibration process involves a sequence of switching in and out of capacitors that tune the operation frequency of the VCO 130. After such "open loop" calibration is completed, the VCO oscillation frequency may be off by many MHz relative to the target frequency. For example, typical scenario is that the VCO 130 is off by 10 MHz. Thus, after calibration, the closed loop action of the PLL 122 must drive the VCO 130 to the desired operating frequency by driving the control voltage to an appropriate value. As mentioned above, this process of driving the control voltage to the appropriate value is referred to as the "lock time." Generally, in fractional-N frequency synthesizers, the strict phase noise requirements and the requirements of fast lock time are conflicting requirements. Thus, a narrow PLL signal filter bandwidth reduces phase noise at the RF carrier at the expense of increased lock time.

For example, in simulations, the phase noise level of the frequency synthesizer with a 35 kHz PLL signal filter is about 3 dB lower than that of the frequency synthesizer with a 40 kHz PLL signal filter bandwidth. However, the lock time of the frequency synthesizer with 35 kHz bandwidth is 25 us larger than the 40 kHz bandwidth case, corresponding to approximately 15%.

Figure 6:
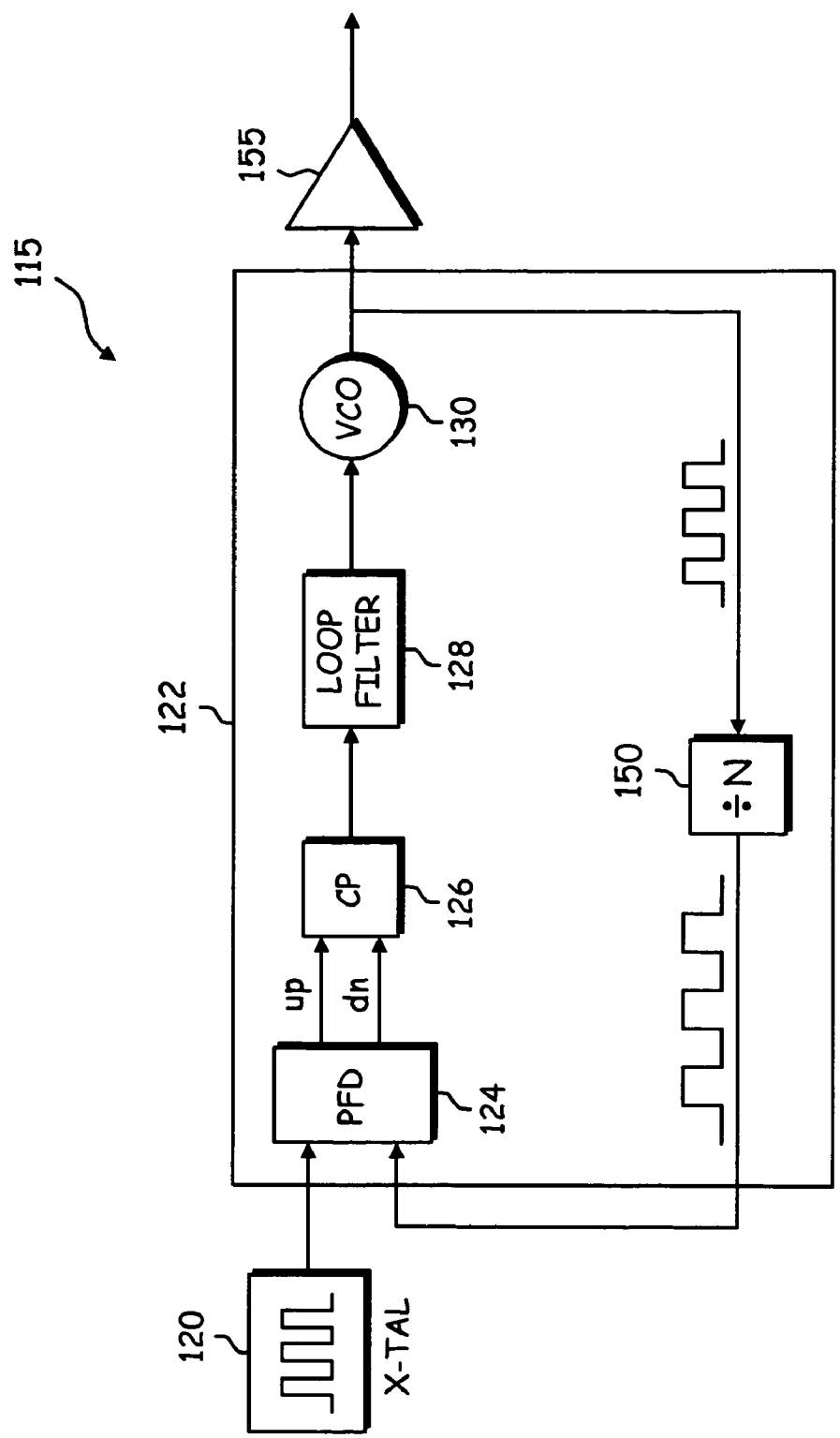
FIG. 6 is a schematic block diagram illustrating an exemplary integer-N frequency synthesizer.

A frequency synthesizer approach that can be designed to satisfy very stringent phase noise requirements is the integer-N frequency synthesizer. An example of an integer-N frequency synthesizer 115 is shown in FIG. 6. The integer-N frequency synthesizer 115 in FIG. 6 includes the same components as the fractional-N synthesizer (e.g., precise crystal oscillator (X-TAL) 120 and phase locked loop (PLL) 122 that includes a phase and frequency detector (PFD) 124, a charge pump (CP) 126, a lowpass loop filter (LPF) 128, a voltage controlled oscillator (VCO) 130, and a divider block 150 in the feedback path). The difference between the integer-N frequency synthesizer 115 of FIG. 6 and the fractional-N frequency synthesizer of FIG. 3 is that the multi-modulus divider of FIG. 3 does not change dynamically during operation of the integer-N frequency synthesizer 115 in a particular RF channel. In other words, the divide ratio of the feedback path remains constant for operation in-between channel steps. The fact that the divide ratio is kept constant causes the PFD/CP combination to operate highly linearly since the phase excursions of the feedback signal are very limited.

However, the integer-N architecture requires that the reference frequency be equal to the desired channel spacing due to the fact that the resolution of the feedback divider 150 is one. Thus, for a channel spacing of 200 kHz, the PLL reference signal produced by X-TAL 120 must be 200 kHz. Such a low reference signal gives rise to considerable "reference spurs" (i.e., periodic modulations of the VCO generating tones around the RF carrier).

For example, when the loop 122 is completely in lock, ideally, no pulses are generated by the CP 126. In practice, due to finite reset delay of the PFD 124 and due to current source mismatches of the CP 126, such ideal equilibrium is not usually achieved. Rather, the VCO control voltage experiences a finite transient at each phase comparison instant around an equilibrium point. Thus, the VCO 130 output, i.e., an RF signal, which is input to a power amplifier 155 for amplification prior to transmission to an up-conversion module or a down-conversion module (as shown in FIG. 2), contains sidebands corresponding to such "feedthrough" of the reference frequency. The problem of reference spurs is a difficult one, especially if the reference spurs fall in-band. Designing the PLL 122 with a narrow PLL signal filter may provide some attenuation of such reference spurs, but in many systems it is difficult or impossible to attenuate such spurs enough while at the same time employing a PLL signal filter bandwidth large enough to ensure fast synthesizer settling (lock time).

Thus, fractional-N and integer-N frequency synthesizers each have advantages and drawbacks. For fractional-N synthesizers, the advantages are fine frequency resolution, while employing a relatively high reference frequency. This allows for a strong attenuation of the reference spurs through the PLL signal filter while still maintaining wide enough bandwidth for fast synthesizer settling (lock time). The drawback of the fractional-N synthesizer is an elevated in-band phase noise level due to the triggering of PFD/CP non-linearities. For integer-N synthesizers, the advantage is generally very low in-band phase noise. The drawback is a high reference spur level, which can only be reduced by narrowing the PLL signal filter. Such narrowness results in slow synthesizer settling (lock time).

Embodiments of the present invention-combine the advantages of the fractional-N and integer-N frequency synthesizers without introducing any of the drawbacks by employing an integer-N type loop with a reference signal provided by a digital processor that generates a high-frequency reference signal which can be converted to analog using a digital-to-analog converter (DAC) operating at a high sampling rate. Fine frequency adjustment is achieved by fine-tuning the digital reference signal, rather than modulating the divide ratio in the feedback path as in a fractional-N synthesizer.

Figure 7:
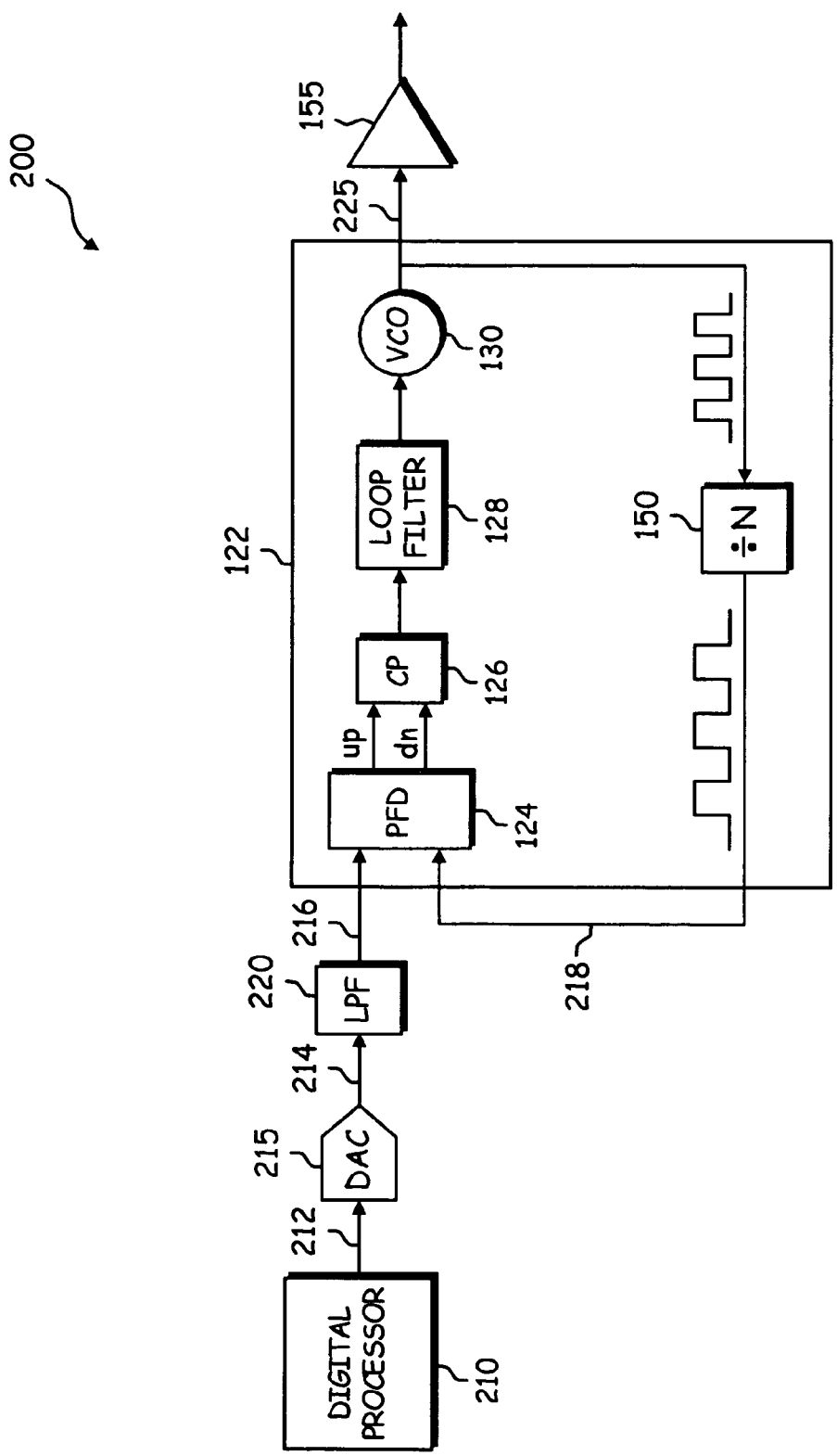
FIG. 7 is a schematic block diagram of an exemplary frequency synthesizer in accordance with embodiments of the present invention.

FIG. 7 is a schematic block diagram of an exemplary frequency synthesizer 200 in accordance with embodiments of the present invention. As can be seen in FIG. 7, the frequency synthesizer 200 according to the present invention is similar to the conventional integer-N frequency synthesizer shown in FIG. 6, in that the multi-modulus divider does not change dynamically during operation of the synthesizer in a particular RF channel. However, the reference frequency is not provided by a static crystal reference, but instead is generated in a digital processor 210 and converted to analog using a DAC 215 and a lowpass filter 220. The DAC 215 operates at a high sampling rate so as to ensure adequate attenuation of digital images via the lowpass filter 220 prior to being input to the PFD 124 of the PLL 122.

A qualitative description of the operation of the frequency synthesizer 200 of the present invention is as follows. The digital processor 210 generates a digital reference signal 212 tuned around 40 MHz, which is converted to an analog reference signal 214 by DAC 215. The analog reference signal 214 is filtered by LPF 220 to produce a filtered analog reference signal 216 to the reference input of the PFD 124. The output of the PFD 124 is an error signal (in phase and/or frequency) between the filtered analog reference signal 216 and a feedback signal 218. The charge pump 126 responds to the (UP,DN) control signals of the PFD 124 by either "pumping" current into the loop filter 128 or moving current out of the loop filter 128 and "pumping" it into ground. The current pulses of the CP 126 are filtered by the loop filter 128 thereby generating a smooth output voltage referred to as the "control voltage", $v_{ctrl}$. The oscillation frequency of the VCO 130 of the PLL 122 is determined by the control voltage, $v_{CTRL}$, supplied by the loop filter 128. The VCO 130 oscillation 225, e.g., RF output signal, is received and amplified by a power amplifier 155 for transmission to an up-conversion module or a down-conversion module. The divider block 150 is coupled to receive the oscillation produced by the VCO 130 and to divide the VCO output by a constant divide ratio to produce the analog feedback signal input to the PFD 124.

Fine frequency tuning, similar to the fine frequency tuning achievable by the fractional-N frequency synthesizer shown in FIG. 3, is provided by finely tuning the reference signal via the digital processor 210. The DC gain of the frequency synthesizer 200 is equal to N so a change of Δf in the reference frequency results in a change of the product of N and Δf at the VCO 130 output. Conversely, changing the divider N 150 by 1 changes the frequency of the output signal 225 by an amount equal to the frequency of the filtered analog reference signal 216.

It should be understood that modifications of the synthesizer architecture of FIG. 7 are possible so as to accommodate for various properties of the synthesizer 200. For example, in other embodiments, the frequency output may be equal to ½ times the VCO frequency, which can be achieved by mixing the VCO output by its divided-by-2 version. This is a common technique used to reduce "pulling" of the VCO.

Figure 8:
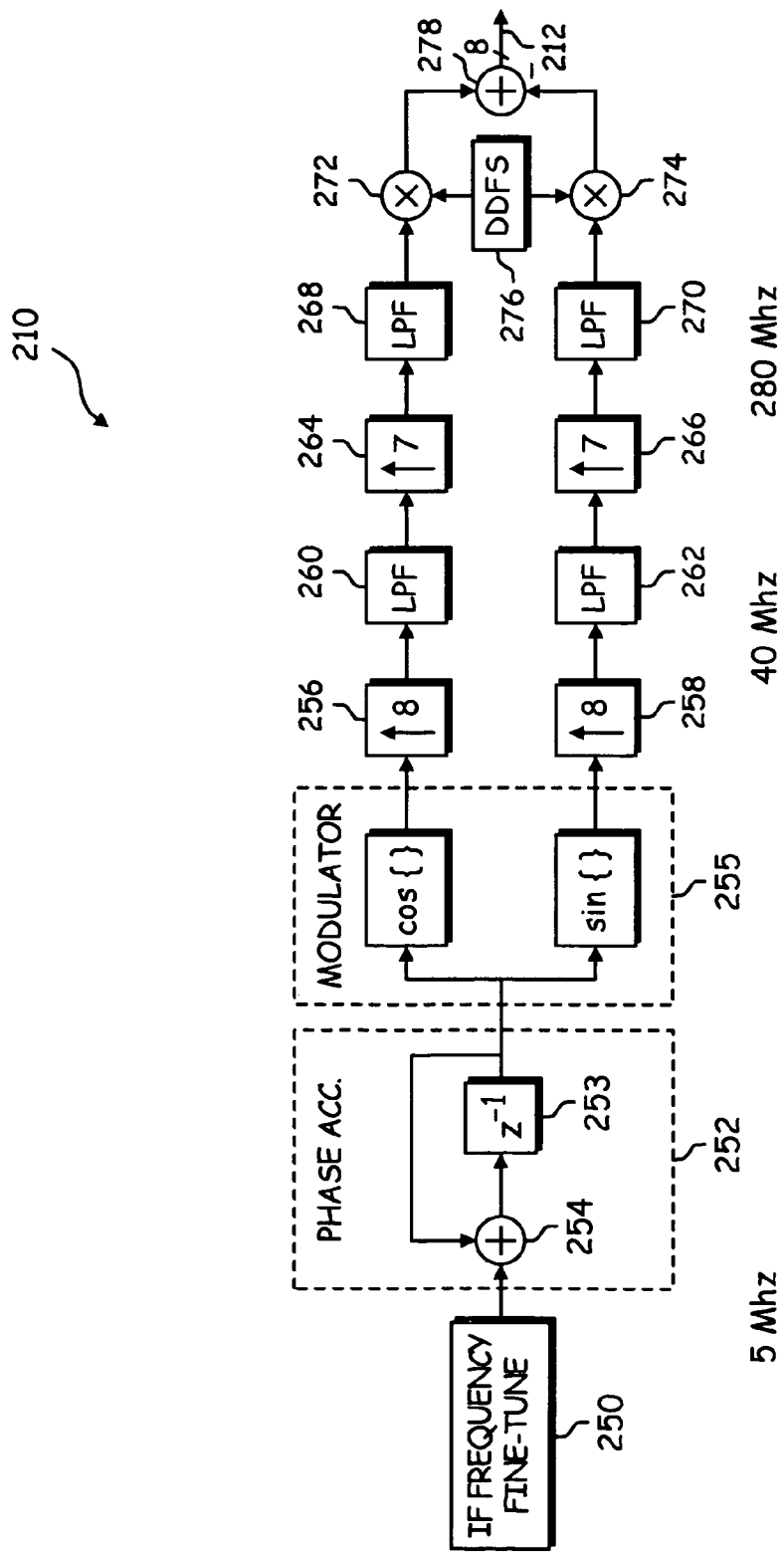
FIG. 8 is a schematic block diagram illustrating exemplary components of a digital processor for use in the frequency synthesizer of the present invention.

FIG. 8 is a schematic block diagram illustrating exemplary components of a digital processor 210 for use in the frequency synthesizer of the present invention. The processor 210 shown in FIG. 8 is appropriate for generating a 40 MHz reference frequency with a sampling rate of 280 MHz. The processor 210 is programmable with a fine-tune frequency constant value 250, here referred to as IF FREQUENCY FINE-TUNE, which determines the frequency deviation of the reference signal from the fixed 40 MHz reference. A phase accumulator 252 comprises a delay element 253 whose output is produced to a feedback loop to integrate the IF FREQUENCY FINE-TUNE value 250 using summation node 254. Thus, phase accumulator 252 generates a phase ramp corresponding to the desired IF FREQUENCY FINE-TUNE value 250. It should be noted that if IF FREQUENCY FINE-TUNE 250 equals zero, the output 212 of the digital processor 210 will be a 40 MHz reference frequency.

A modulator 255 of the digital processor 210 performs the frequency modulation of the phase signal. For example, such modulation function may be implemented by the COordinate Rotation DIgital Computer (CORDIC) algorithm. As is known in the art, the CORDIC rotates a basis vector of the complex plane (1,0) by an amount equal to the output of the phase accumulator 252. The resulting complex number is the output of the modulator 255. Thus, modulator 255 modulates the phase signal output from the phase accumulator 252 and produces corresponding I & Q vector digital data.

The I vector digital data is produced to an upsampler 256 that upsamples the I vector digital data. In the described embodiment of the invention, the I vector digital data is upsampled 8 times to produce a sample frequency of 40 MHz. Upsampler 256 produces upsampled I vector (in-phase) data to a low-pass filter 260 that produces filtered I vector data. The filtered I vector data is again produced to another upsampler 264 that upsamples the filtered I vector data. In the described embodiment of the invention, the filtered I vector data is upsampled 7 times to produce a sample frequency of 280 MHz. Upsampler 264 produces upsampled I vector (in-phase) data to another low-pass filter 268 that produces filtered I vector data. The filtered I vector data is produced to a multiplier 272 that is further coupled to receive modulation data (a repeating sequence of 1, 0, −1, 0) from a direct digital frequency synthesizer (DDFS) 276 for multiplying with successive bits of the filtered I vector (in-phase) data.

Similarly, modulator 255 produces Q vector (quadrature phase) digital data to an upsampler 258. Upsampler 258 upsamples the Q vector digital data by the same amount as upsampler 256. In the described embodiment, the data is upsampled by a factor of 8. Generally, the I and Q branches are upsampled by an equivalent amount. Upsampler 258 produces upsampled Q vector data to a low-pass filter 262 that, in turn, produces filtered Q vector data to another upsampler 266. Upsampler 266 upsamples the Q vector digital data by the same amount as upsampler 264. In the described embodiment, the data is upsampled by a factor of 7. Upsampler 266 produces upsampled Q vector data to another low-pass filter 270 that, in turn, produces filtered Q vector data to a multiplier 274. Multiplier 274 also is coupled to receive modulation data, namely (a repeating sequence of 0, −1, 0, 1) from DDFS 276 which it multiplies with successive bits of the filtered Q vector (quadrature) data.

The DDFS 276 produces outputs that are used by the pair of multipliers 272 and 274 to translate the complex digital baseband signal to a complex digital modulated signal at a desired reference frequency. The DDFS 276 outputs a cosine function and a sine function. The first multiplier 272 multiplies the filtered I vector data (in-phase signal) by the cosine function to produce a first digital signal, while the second digital multiplier 274 multiplies the filtered Q vector data (quadrature-phase signal) by the sine function to produce a second digital signal. The outputs of multipliers 272 and 274 are then produced to a subtraction node 278 that produces the digital reference signal 212.

The DDFS 276 translates the digital baseband signal to the desired reference frequency by effectively frequency shifting the baseband signal by 40 MHz. Thus, if the IF FREQUENCY FINE-TUNE value 250 corresponds to a frequency of 100 kHz, the output digital reference signal 212 equals 40.1 MHz. It should be understood that different upsampling amounts may be used according to design requirements including tolerable frequency bands for harmonics as is known by one of average skill in the art.

Figure 9:
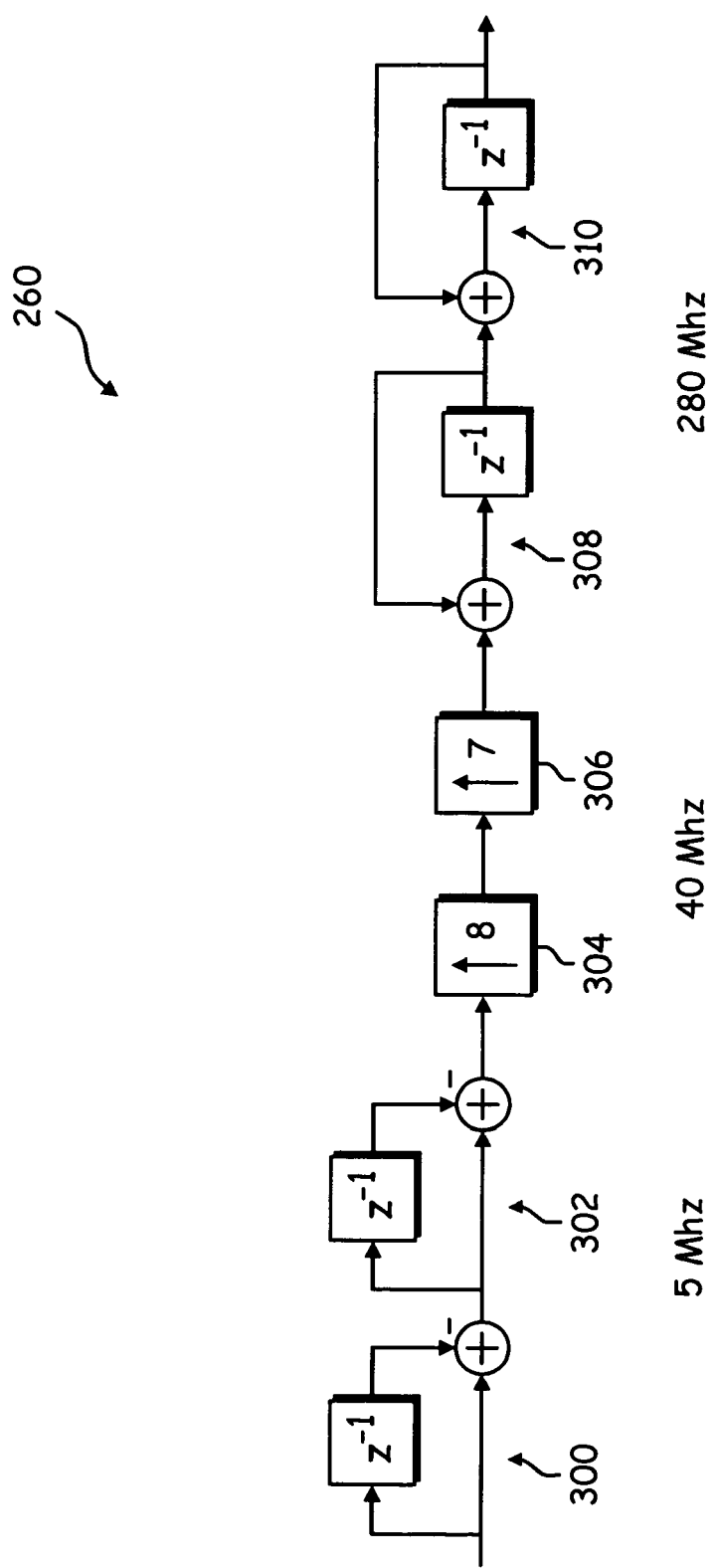
FIG. 9 is a schematic block diagram illustrating an exemplary interpolation filter for use in the digital processor of the frequency synthesizer of the present invention.

FIG. 9 is a schematic block diagram illustrating an exemplary interpolation filter (e.g., interpolation filter 260 from FIG. 8) for use in the digital processor of the frequency synthesizer of the present invention. The interpolation filter 260 includes a 2-stage differentiator 300 and 302 followed by the 8-fold up-sampling module 304, followed by a 7-fold up-sampler 306, followed by a 2nd order integrator 308 and 310. The circuit shown in FIG. 9 provides a simplified implementation of a high performance interpolation filter in that, at a minimum, it eliminates the need for multipliers. However, it should be understood that numerous other low pass filter designs can be used instead of the design illustrated in FIG. 9.

Figure 10:
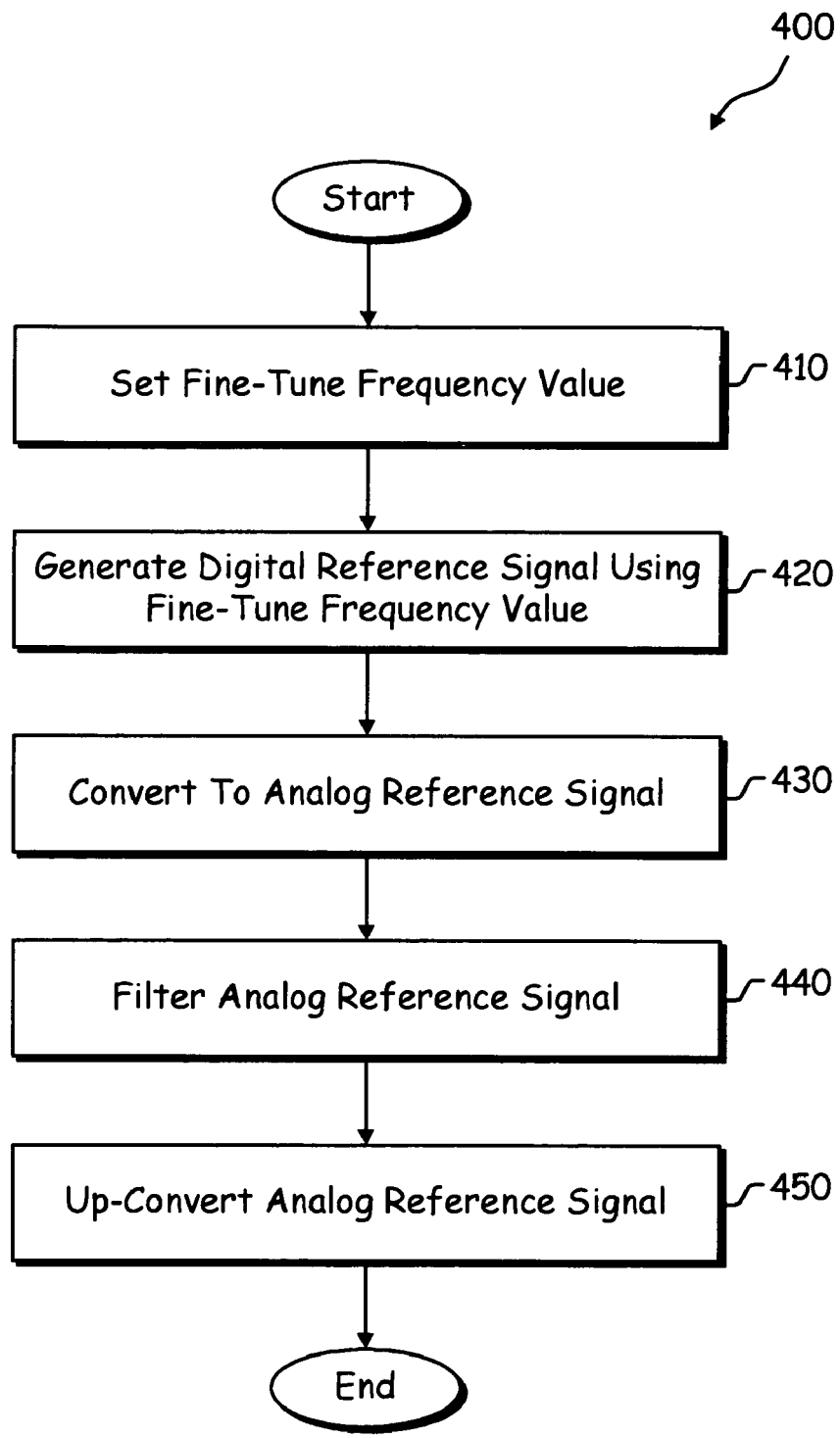
FIG. 10 is a flowchart illustrating one method of the present invention.

FIG. 10 is a flowchart illustrating one method 400 of the present invention for synthesizing an RF signal using a PLL frequency synthesizer. Initially, the fine-tune frequency value is set to control the deviation of the digital reference signal from a fixed frequency value (e.g., 40 MHz) and enable the digital reference signal to be generated at the finely-tuned reference frequency (step 410). Using the programmed fine-tune frequency value, the digital processor generates the digital reference signal to finely tune the reference frequency of the digital reference signal (step 420). Thereafter, the digital reference signal is converted to an analog reference signal (step 430), and filtered (step 440) to remove any digital images present in the analog reference signal. The filtered analog reference signal is up-converted to an output RF signal using an integer-N-type PLL (step 450).

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but, on the contrary, the invention is to cover all modifications, equivalents and alternatives falling within the spirit and scope of the present invention as defined by the claims. As may be seen, the described embodiments may be modified in many different ways without departing from the scope or teachings of the invention.

The invention claimed is:

1. A frequency synthesizer for use in a transceiver, comprising:
   a digital processor operable to generate a digital reference signal, the digital processor capable of generating the digital reference signal as a finely-tuned reference frequency, the digital processor including a phase accumulator operably coupled to receive a fine-tune frequency value and operable to generate a phase signal corresponding to the fine-tune frequency value and a modulator operably coupled to receive the phase signal and operable to modulate the phase signal to produce a complex digital signal from which the digital reference signal is produced;
   a Digital-to-Analog Converter (DAC) operably coupled to receive the digital reference signal and operable to convert the digital reference signal to an analog reference signal;
   a low pass filter operably coupled to receive the analog reference signal and operable to filter the analog reference signal to produce a filtered analog reference signal; and
   a phase locked loop operably coupled to receive the filtered analog reference signal to up-convert the filtered analog reference signal from an IF signal to an RF signal.

2. The frequency synthesizer of claim 1, wherein the digital processor is programmed with the fine-tune frequency value to control the deviation of the digital reference signal from a fixed frequency value and enable the digital reference signal to be generated at the finely-tuned reference frequency.

3. The frequency synthesizer of claim 1, wherein the modulator is a coordinate rotation digital computer (CORDIC) module.

4. The frequency synthesizer of claim 1, wherein the digital processor further includes at least one digital low pass filter operably coupled to receive the complex digital signal, wherein the at least one digital low pass filter is operable to filter the complex digital signal to produce a filtered complex digital signal.

5. The frequency synthesizer of claim 4, wherein the at least one digital low pass filter is an interpolation filter.

6. The frequency synthesizer of claim 4, wherein the filtered complex digital input signal includes an in-phase signal and a quadrature-phase signal, and wherein the digital processor further comprises:
   a direct digital frequency synthesizer for generating a cosine digital function and a sine digital function,
   a first digital multiplier connected to receive the in-phase signal, wherein the first digital multiplier is operable to multiply the in-phase signal with the cosine digital function to produce a first digital signal,
   a second digital multiplier connected to receive the quadrature-phase signal, wherein the second digital multiplier is operable to multiply the quadrature-phase signal with the sine digital function to produce a second digital signal, and
   a subtraction node connected to receive the first digital signal and the second digital signal, wherein the subtraction node is operable to subtract the first digital signal from the second digital signal to produce the digital reference signal.

7. The frequency synthesizer of claim 1, wherein the phase locked loop is an integer-N phase locked loop.

8. The frequency synthesizer of claim 1, wherein the phase locked loop includes a phase and frequency detector connected to receive the filtered analog reference signal and a feedback signal, wherein the phase detector is operable to produce an error signal indicative of a difference in phase or frequency between the filtered analog reference signal and the feedback signal.

9. The frequency synthesizer of claim 8, wherein the phase locked loop further includes a charge pump operably coupled to receive the error signal and generate a current pulse proportional to the error signal, and wherein the phase locked loop further includes a loop filter operably coupled to receive the current pulse and operable to filter the current pulse to produce a control voltage.

10. The frequency synthesizer of claim 9, wherein the phase locked loop further includes a voltage controlled oscillator operably coupled to receive the control voltage and operable to track the phase of the digital reference signal based on the control voltage to produce the feedback signal.

11. The frequency synthesizer of claim 10, wherein the phase locked loop further includes a frequency divider operably coupled to receive the feedback signal and divide the feedback signal by an integer divide ratio, and wherein the feedback signal generated by the voltage controlled oscillator is the RE signal having a frequency equal to the product of the frequency of the filtered analog reference signal and the divide ratio.

12. A method for synthesizing an RF signal for use in a transceiver, comprising the steps of:
generating a phase signal corresponding to a fine-tune frequency value;
modulating the phase signal to produce a complex digital signal;
filtering the complex digital signal to produce a filtered complex digital signal
generating a digital reference signal from the filtered complex digital signal at a reference frequency capable of being a finely-tuned reference frequency based on the fine-tune frequency value;
converting the digital reference signal to an analog reference signal;
filtering the analog reference signal to produce a filtered analog reference signal; and
up-converting the filtered analog reference signal from an IF signal to an RF signal.

13. The method of claim 12, further comprising the step of:
using the fine-tune frequency value to control the deviation of the digital reference signal from a fixed frequency value to enable the digital reference signal to be generated at the finely-tuned reference frequency.

14. The method of claim 12, wherein the filtered complex digital input signal includes an in-phase signal and a quadrature-phase signal, and wherein the step of generating the digital reference signal further comprises:
generating a cosine digital function and a sine digital function,
multiplying the in-phase signal with the cosine digital function to produce a first digital signal,
multiplying the quadrature-phase signal with the sine digital function to produce a second digital signal, and
subtracting the first digital signal from the second digital signal to produce the digital reference signal.

15. The method of claim 12, wherein the step of up-converting the filtered analog signal further comprises:
producing an error signal indicative of a difference in phase or frequency between the filtered analog reference signal and a feedback signal
generating a current pulse proportional to the error signal,
filtering the current pulse to produce a control voltage, and
generating the feedback signal to track the phase of the filtered analog reference signal based on the control voltage.

16. The method of claim 15, wherein the step of up-converting the filtered analog signal further comprises:
dividing the feedback signal by an integer divide ratio, and wherein the feedback signal is the RF signal having a frequency equal to the product of the frequency of the filtered analog reference signal and the divide ratio.

* * * * *

UNITED STATES PATENT AND TRADEMARK OFFICE
CERTIFICATE OF CORRECTION

PATENT NO. : 7,324,789 B2
APPLICATION NO. : 11/039116
DATED : January 29, 2008
INVENTOR(S) : Henrik T. Jensen Page 1 of 1

It is certified that error appears in the above-identified patent and that said Letters Patent is hereby corrected as shown below:

Column 17, line 23, in Claim 11: replace "RE" with --RF--.

Signed and Sealed this

Twenty-fourth Day of February, 2009

JOHN DOLL
*Acting Director of the United States Patent and Trademark Office*